(12) United States Patent
Campini

(10) Patent No.: US 7,170,753 B2
(45) Date of Patent: Jan. 30, 2007

(54) INTERFACE ENHANCEMENT FOR MODULAR PLATFORM APPLICATIONS

(75) Inventor: Edoardo Campini, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 268 days.

(21) Appl. No.: 10/749,285

(22) Filed: Dec. 30, 2003

(65) Prior Publication Data
US 2005/0141207 A1 Jun. 30, 2005

(51) Int. Cl.
*H05K 1/14* (2006.01)
(52) U.S. Cl. ............. 361/737; 361/715; 361/760; 361/727
(58) Field of Classification Search ............ 361/715, 361/752, 737, 760, 790, 797, 800–802
See application file for complete search history.

(56) References Cited

U.S. PATENT DOCUMENTS

| | | | | |
|---|---|---|---|---|
| 5,032,951 | A | * | 7/1991 | Schropp et al. ............. 361/726 |
| 5,446,621 | A | | 8/1995 | Jansen et al. |
| 5,859,591 | A | | 1/1999 | Marmonier |
| 5,999,990 | A | | 12/1999 | Sharrit et al. |
| 6,185,110 | B1 | * | 2/2001 | Liu ............................ 361/829 |
| 6,560,106 | B2 | * | 5/2003 | Ivey et al. .................. 361/695 |
| 6,570,770 | B1 | * | 5/2003 | Ross et al. .................. 361/752 |
| 6,935,868 | B1 | | 8/2005 | Campini et al. |
| 2003/0235042 | A1 | * | 12/2003 | Harris et al. ................ 361/752 |
| 2005/0141200 | A1 | | 6/2005 | Campini et al. |

FOREIGN PATENT DOCUMENTS

EP      0 800 248 A1    10/1997

OTHER PUBLICATIONS

Advanced TCA™, PICMG® 3.0 Revision 1.0, Advanced TCA™ Base Specification, Dec. 30, 2002, pp. i-414.
Release Notes, PICMG ECN 3.0-1.0-001, Feb. 17, 2004, pp. 1-4, with AdvancedTCA®, PICMG Specification, Engineering Change Notice 3.0-1.0-001.
Jan. 14, 2004, Affected Specification: PICMG 3.0 R1.0, pp. i-D-12.

* cited by examiner

*Primary Examiner*—Kamand Cuneo
*Assistant Examiner*—Hung S. Bui
(74) *Attorney, Agent, or Firm*—Schwabe, Williamson & Wyatt, P.C.

(57) ABSTRACT

An interface enhancing apparatus is provided for increasing the potential number of interfaces on the interface panel of a modular platform board. The interface enhancing apparatus may include a first component coupled an interface panel of a modular platform board and second component coupled to the first component. The second component may be substantially parallel with the interface panel when the first component is mated with the interface panel, and the second component may have one or more enhanced interfaces configured for electrical communication with the modular platform board.

15 Claims, 2 Drawing Sheets

INTERFACE ENHANCEMENT FOR MODULAR PLATFORM APPLICATIONS

FIELD OF THE INVENTION

Embodiments of the invention generally relate to modular computing systems, such as, systems in accordance or in compliance with the specification of the Advanced Telecom Computing Architecture (ATCA). More specifically, disclosed embodiments relate to enhancing the interface capability of modular platform boards.

BRIEF DESCRIPTION OF THE DRAWINGS

The invention is illustrated by way of example and not by way of limitation in the figures of the accompanying drawings, in which the like references indicate similar elements and in which.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Embodiments in accordance with the present invention pertain to enhancing the interfaceability of modular platforms. Modular platform boards are used in a variety of modular platform applications, including, but not limited to, enterprise servers, telecommunications servers, flexi-servers, and the like. One particular example where modular platform boards are being used is for Advance Telecommunications Computing Architecture (ATCA) solutions. ATCA requirements are set forth in the PCI Industrial Computer Manufacturers Group (PICMG) 3.0 ATCA Specification (ATCA Specification), which is targeted to the next generation of carrier grade communication equipment.

Figure 1:
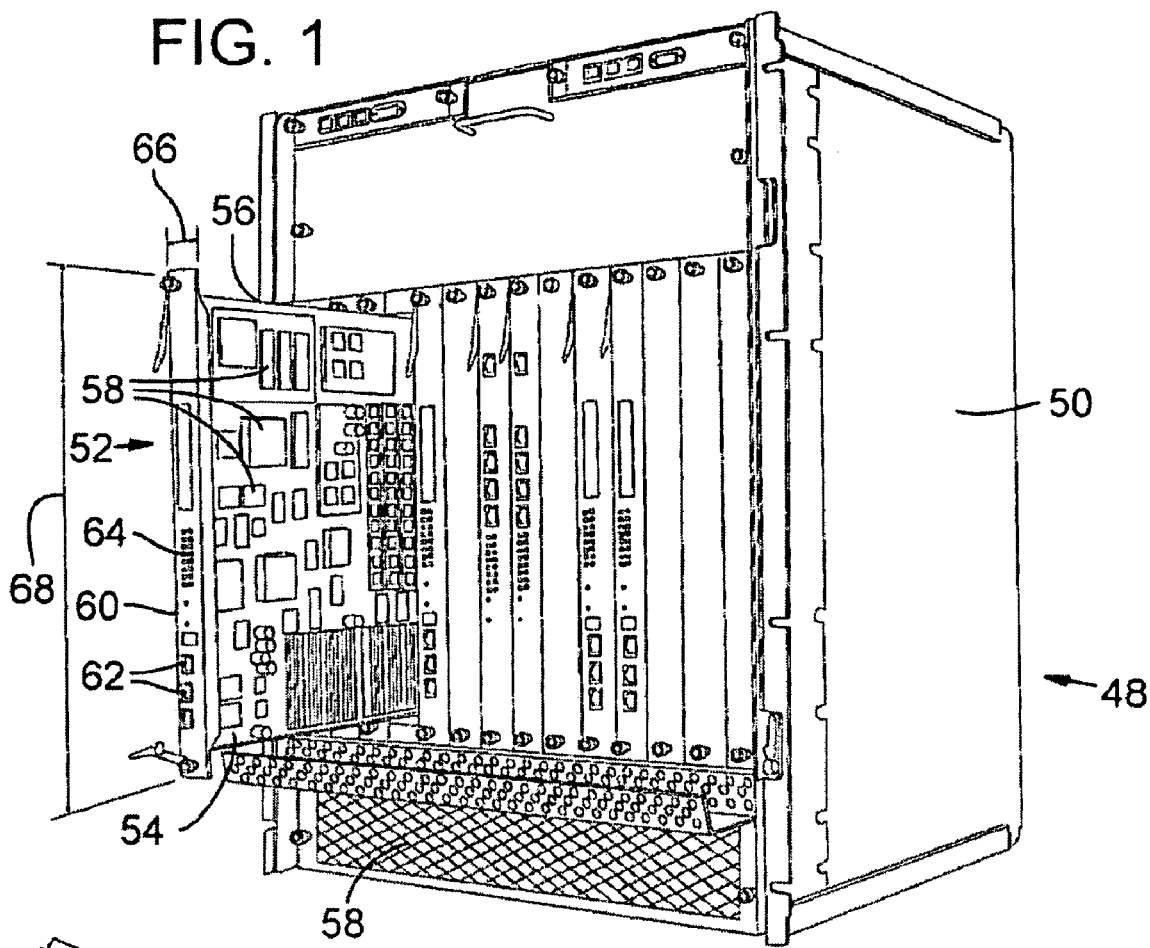
FIG. 1 illustrates a perspective view of a modular platform.

FIG. 1 illustrates an example of a modular platform 48, which may also be referred to as a shelf in some specifications, such as the ATCA Specification. Modular platform 48 may include a chassis 50 and a plurality of high-density modular platform boards 52 vertically positioned in a horizontal array. Modular platform board 52 may be configured with any number of electronic components 58 to accommodate the necessary functionality required. Such electronic components 58 may include, but are not limited to, microprocessors, memory, buses, capacitors, transistors, and the like.

Modular platform board 52 also may have an interface panel 60 and a rear interface (not shown). Interface panel 60 may have one or more interface panel interfaces, such as active I/O interfaces 62 and passive interfaces 64. Passive interfaces 64 may include, but are not limited to, audible and visual indicators, such as LED lights. Active interfaces 62 may include various I/O connectors, including, but not limited to USB, Institute of Electrical and Electronics Engineers (IEEE) 1394, serial, ethernet, sonnet, and other interface ports, as well as expansion slots for cards such as mezzanine cards. Interface panel interfaces 62, 64 may be in electrical communication with components 58. Active I/O interfaces 62 may enable the modular platform board to interface with a variety of peripheral components and infrastructures, including, but not limited to, LANs, WANs, Internet, switches, routers, bridges, hubs, PBXs, gateways, firewalls, and the like.

Due in part to the density in which modular platform boards may be positioned, the interface panel of a modular platform board is typically very limited in width and height. Many specifications and design requirements set specific parameters for such width and height. Because of the variety of I/O interfaces 62 and passive interfaces 64 that may be required on the interface panel 60, the height 68 and width 66 restrictions allow for only a limited number of interfaces 62, 64. For example, the ATCA Specification limits the height 68 to 350.93 mm and width 66 to 28.95 mm.

The ATCA Specification, and others, further limit the dimensional space, or protrusion distance, in front of the interface panel 60 for connectors, expansion slots, cable routing, and the like. The ATCA Specification limits this space to 95 mm. However, much of this space goes unused due in part to the limited number of interfaces that may be positioned on an interface panel. Embodiments in accordance with the present invention provide an interface enhancing apparatus that can expand the active and passive interfaces, while observing necessary dimensional restrictions.

Figure 2:
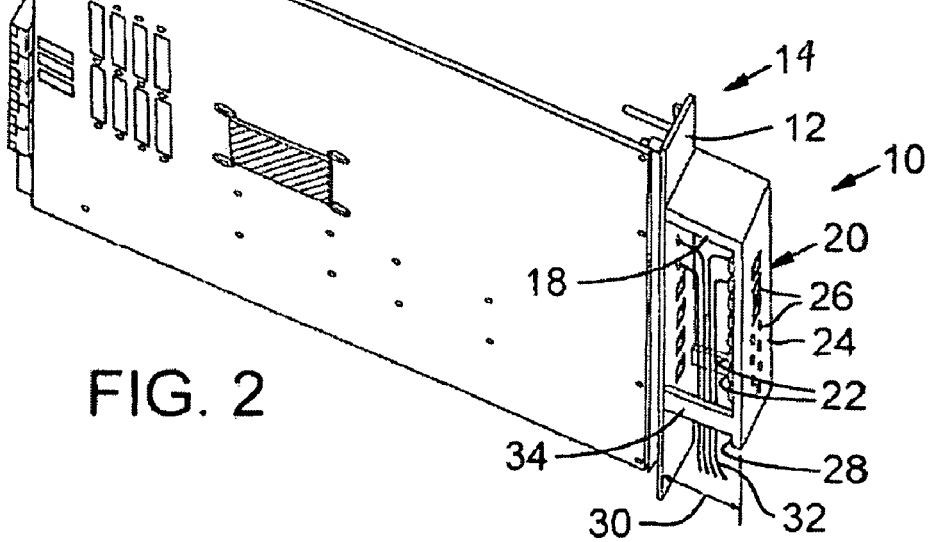
FIG. 2 illustrates a perspective view of a modular platform board in accordance with an embodiment of the present invention.

FIG. 2 illustrates a perspective view of a modular platform board in accordance with an embodiment of the present invention. An interface enhancing apparatus 10 may be removably coupled to the interface panel 12 of modular platform board 14. Interface enhancing apparatus 10 may be configured to extend orthogonally away from the interface panel 12 and contain a plurality of enhanced interfaces 26 to maximize the number of front side interfaces while remaining within a specified dimensional requirement 30.

Interface enhancing apparatus 10 may include a first component which may be a substantially horizontal component 18 extending from interface panel 12. Horizontal component 18 may include a flex circuit or other power and signal routing form factor such as a printed circuit board (PCB) or other carrier substrate. Horizontal component 18 may be removably coupled to interface panel 12 through an electrical communication interface such as a card edge connector or any other suitable connector, which may include, but are not limited to, various styles of pin and socket type connectors. In addition to wired connections, there could also be some variation of unwired connections, such as infrared, acoustic, light, or RF.

A second component, which may be a vertical component 20 may be coupled to horizontal component 18, and extend in a generally parallel manner to the interface panel 12. Vertical component 20 may include a carrier substrate or other power and signal routing device that is in electrical communication with the flex circuit of horizontal component 18. Vertical component 20 may have a plurality of enhanced interfaces 22 that are in electrical communication with the modular platform board 14 and the electronic components disposed thereon via the carrier substrate and flex circuit of vertical component 20 and horizontal component 18, respectively. Enhanced interfaces may include I/O interfaces similar to those suitable for mounting on the interface panel 12, and include, but are not limited to, USB, IEEE 1394, serial, ethernet, sonnet, and other interface ports. A variety of passive interfaces 26 may also be included on the opposite or outward facing edge 24 of vertical component 20, such that such passive interfaces 26 may be observed from a position facing the modular platform board 14.

Vertical component 20 may extend generally parallel to the modular platform board 14 to which it is connected. The carrier substrate in the horizontal component 18 and the vertical component 20 may be continuous, in that the two components need not be separate components.

Where adjacent modular platform boards may use an interface enhancement apparatus in accordance with embodiments of the present invention, the width of vertical component 20 may be sized to be less than or equal to the width of the interface panel 12 to accommodate an adjacent interface enhancing apparatus.

Interface enhancing apparatus 10 may be sized such that the protrusion distance 30 of Interface enhancing apparatus is less than or equal to a maximum distance required by a specification. In the case of the ATCA Specification, the protrusion distance 30 may be less than or equal to 95 mm. The space in between the interface panel 12 and the inward facing edge 28 of vertical component 20 may be reserved for connectors and the routing of cables 32.

To provide additional structural support to vertical component 20, support brackets 34 may interconnect vertical component 20 directly to interface panel 12. Brackets 34 may be removably connected to interface panel 12, such that when interface enhancement apparatus 10 is not required, the brackets 34 need not remain connected to the interface panel 12. Support brackets 34 may assist interface enhancement apparatus 10 resist disconnection at the removable interface as well as other environmental hazards.

Figure 3:
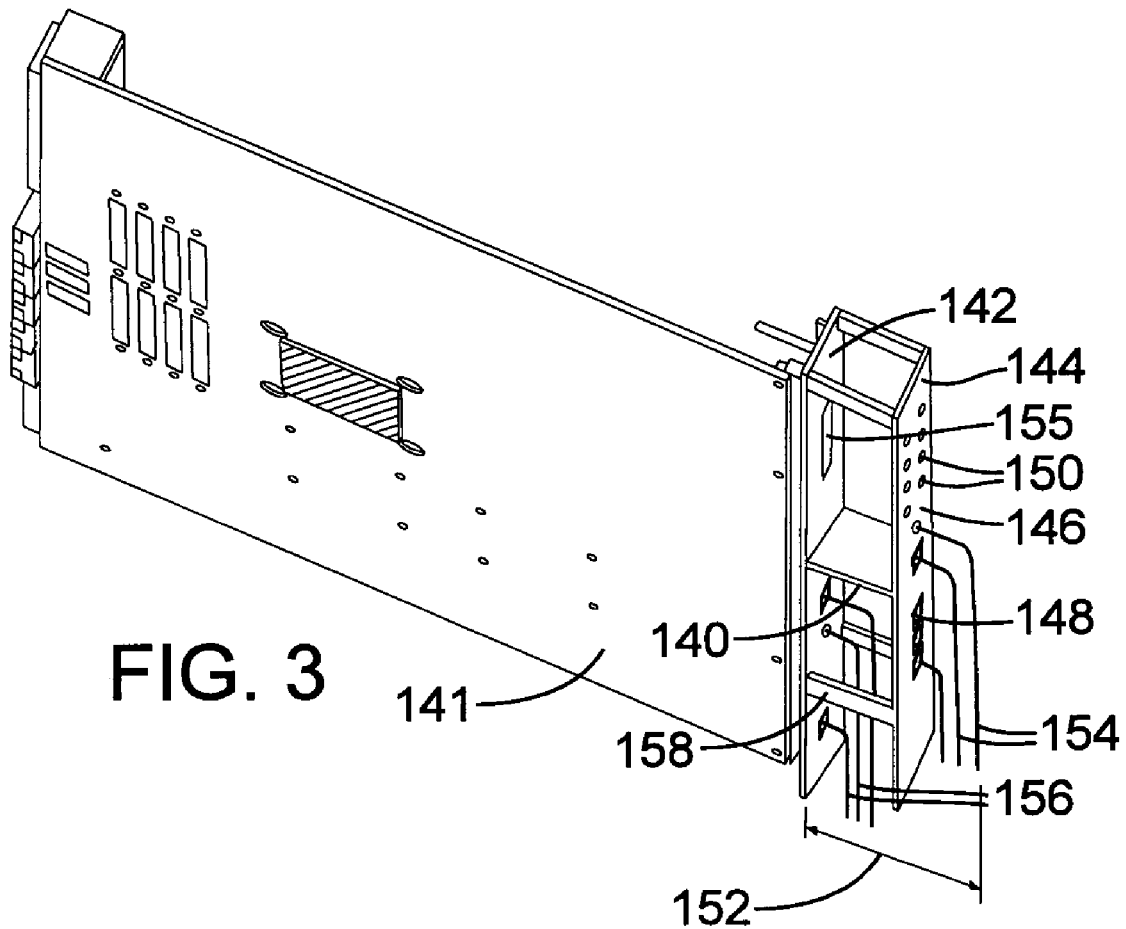
FIG. 3 illustrates a perspective view of an interface enhancing apparatus in accordance with an embodiment of the present invention.

It can be appreciated that the enhanced interfaces need not be positioned on the inward facing edge of vertical component 20, but may be positioned about the outward facing edge. FIG. 3 illustrates a perspective view of an interface enhancing apparatus in accordance with an embodiment of the present invention. A first component, for example a horizontal component 140 may be removably coupled to interface panel 142 of modular platform board 141, and configured with a flex circuit or other routing device that may be in electrical communication with electronic components on the modular platform board 141.

A first component, for example a vertical component 144 may be mechanically and electrically coupled with horizontal component 140. A plurality of I/O interfaces 148 and passive interfaces 150 may be disposed on the outward facing edge 146 of vertical component 144. The aggregate protrusion of interior cables 156, horizontal component 140, vertical component 144 and outer cables 154 may be less than or equal to the allowable aggregate protrusion distance 152. Additional support brackets 158 may be used to structurally support vertical component 144.

In one embodiment, a horizontal component may be configured to interface with an expansion slot 155 in the interface panel 142. An example of such an interconnection may be through a mezzanine card slot in ATCA modular platform boards.

In accordance with an embodiment of the present invention, the interface enhancing apparatus may be removably coupled to the interface panel. In such a case, the various I/O interfaces of the interface enhancing apparatus may be coupled to the appropriate cabling prior to coupling to the interface panel. This ability to pre-wire may provide interface flexibility with the modular platform boards. For example, typically, the modular platform may have a certain number of primary modular platform boards and the same number of redundant modular platform boards. If a primary modular platform board fails, the redundant modular platform board can serve as a backup. Where an interface enhancing apparatus is coupled to a primary modular platform board, should a failure occur in that board, the interface enhancing apparatus, which may be fully connected to external sources, may be quickly and without deenergizing the system switched to the redundant modular platform board. Similarly if a modular platform board needs to be swapped for a different board, there the interface enhancing apparatus need only be decoupled from the modular platform board being changed out and recoupled to the new modular platform board without having to disconnect and reconnect cables connected the enhanced I/O interfaces.

Though many of the embodiments described herein referred to the requirements of the ATCA Specification by way of example, it is contemplated that embodiments in accordance with the present invention may be applied to other modular platforms that may have modular platform boards and panels that allow for a variety of interfaces, including I/O and indicator interfaces. Further, as the modular platform boards illustrated with embodiments in accordance with the present invention are positioned in a vertical configuration, they are not so limited, and may be horizontally positioned, for example, in a vertical array.

Also, embodiments in accordance with the present invention may be used to enhance the interfaceability of rear modular platform boards having a series of interfaces, such as I/O and audio-visual interfaces, on an interface panel exposed from the shelf's back side. One such example may be the Rear Transfer Module (RTM) in an ATCA shelf. The RTM may include a modular platform board accessible from the back side of a shelf and may have an interface panel configured with various interfaces. The interface enhancing apparatus in accordance with the present invention may be coupled to such a faceplate to enhance the interfaceability of the RTM.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. An interface enhancing apparatus, comprising:
   a first component configured to be mechanically mated, removably and orthogonally, with an interface panel of a modular platform board, the interface panel having first one or more interfaces positioned thereon for interfacing first one or more devices to the modular platform board;
   a second component orthogonally joined with the first component, enabling the second component to be substantially parallel with and spaced apart from the interface panel when the first component is removably and orthogonally mated with the interface panel, the second component having second one or more interfaces configured for interfacing second one or more devices with the modular platform board;

the second component having a first face facing away from the interface panel and an opposite second face facing the interface panel;

the second one or more interfaces are positioned on the second face of the second component; and the second component defines a space relative to the interface panel of the modular platform board that is sufficient to protectively accommodate cabling for interfacing the first and second devices to the first and second one or more interfaces respectively, and the space being accessible from either side of the second component.

2. The interface enhancing apparatus of claim 1, wherein the first component includes a carrier substrate configured to electrically interconnect the second component with the modular platform board.

3. The interface enhancing apparatus of claim 2, wherein the carrier substrate is one of a printed circuit board, flex circuit, discrete metal wires, fiberoptic cables, and unwired connections.

4. The interface enhancing apparatus of claim 1, wherein the second component includes a carrier substrate configured to electrically interconnect the first component.

5. The interface enhancing apparatus of claim 4, wherein the carrier substrate is one of a printed circuit board, flex circuit, discrete metal wires, fiberoptic cables, and unwired connections.

6. The interface enhancing apparatus of claim 1, wherein the one ore more enhanced interfaces include one or more I/O interfaces.

7. The interface enhancing apparatus of claim 1, wherein the one or more I/O interfaces are selected from a group of connectors including IEEE 1394, Ethernet, USB, Serial, cable, and fiberoptic.

8. The interface enhancing apparatus of claim 1, wherein the one or more interfaces are positioned on the first side.

9. The interface enhancing apparatus of claim 1, wherein an aggregate protrusion distance from the interface panel is within a predetermined dimension requirement of the standard.

10. The interface enhancing apparatus of claim 9, wherein the predetermined dimension requirement is 95mm.

11. The interface enhancing apparatus of claim 9, wherein the aggregate protrusion distance of the first component, second component and the one or more enhanced interfaces is less than or equal to 95 mm.

12. The interface enhancing apparatus of claim 1, wherein the first component is removably coupled to the modular platform board through an expansion slot in the interface panel.

13. The interface enhancing apparatus of claim 12, wherein the expansion slot is a mezzanine card module.

14. The interface enhancing apparatus of claim 1, further comprising a support bracket removably coupled between the second component and the interface panel to provide additional support for the second component.

15. The interface enhancing apparatus of claim 1, wherein the first component and the second component are a single unit having a single carrier substrate.

* * * * *